US011055109B2

(12) United States Patent
Ish-Am et al.

(10) Patent No.: US 11,055,109 B2
(45) Date of Patent: Jul. 6, 2021

(54) ACCELERATION MODULE SUPPORTING CONTROLLED CONFIGURATION OF A PROGRAMMABLE LOGIC DEVICE

(71) Applicant: Mellanox Technologies, Ltd., Yokneam (IL)

(72) Inventors: Oren Ish-Am, Kiryat Tivon (IL); Guy Heller, Tel Aviv (IL); Noam Cohen, Kfar Saba (IL)

(73) Assignee: MELLANOX TECHNOLOGIES, LTD., Yokneam (IL)

( * ) Notice: Subject to any disclaimer, the term of this patent is extended or adjusted under 35 U.S.C. 154(b) by 208 days.

(21) Appl. No.: 16/400,047

(22) Filed: May 1, 2019

(65) Prior Publication Data
US 2020/0348944 A1    Nov. 5, 2020

(51) Int. Cl.
*G06F 9/445*    (2018.01)
*G06F 11/26*    (2006.01)
(Continued)

(52) U.S. Cl.
CPC .............. *G06F 9/445* (2013.01); *G06F 11/26* (2013.01); *G06F 13/4022* (2013.01);
(Continued)

(58) Field of Classification Search
CPC .. G06F 13/4022; G06F 13/4282; G06F 30/34; G06F 9/445; G06F 9/4406;
(Continued)

(56) References Cited

U.S. PATENT DOCUMENTS 6,172,520 B1    1/2001  Lawman et al.
6,668,237 B1    12/2003  Guccione et al.
(Continued)

FOREIGN PATENT DOCUMENTS

CN    105718009 A    6/2016
CN    107656776 A    2/2018

OTHER PUBLICATIONS

Programmable Single-Chip Master/Target PCI Bridge Solution Supports Networking, Telecommunications, and Video Applications published by Business Wire, Nov. 4, 2002 https://dialog.proquest.com/professional/docview/446387492 (Year: 2002).*
(Continued)

*Primary Examiner* — Joseph O Schell
(74) *Attorney, Agent, or Firm* — Kligler & Associates Patent Attorneys Ltd (57) ABSTRACT

An electronic device includes a processor, a Nonvolatile Memory (NVM), and a Programmable Logic Device (PLD). The NVM stores loadable shell image and user image. The shell image supports communication with the processor, and each of the shell and user images implements a bus client for communication with a host in accordance with a bus protocol. The PLD connects to the processor and to the NVM. Upon initialization, the PLD is configured to load and run the shell image, to receive from the processor, by the shell image, an indication for selecting between the shell and user images, and when the indication selects the user image, to load the user image and run the loaded user image. The process of sequential loading of the shell and user images completes before the host concludes attempting to enumerate the bus client of the user image, in accordance with the bus protocol.

18 Claims, 3 Drawing Sheets

(51) Int. Cl.
*G06F 13/40* (2006.01)
*G06F 13/42* (2006.01)
*G06F 9/4401* (2018.01)
*G06F 30/34* (2020.01)
*G06F 15/78* (2006.01)

(52) U.S. Cl.
CPC .......... *G06F 13/4282* (2013.01); *G06F 9/441* (2013.01); *G06F 9/4406* (2013.01); *G06F 15/7867* (2013.01); *G06F 30/34* (2020.01); *G06F 2213/0026* (2013.01)

(58) Field of Classification Search
CPC .................. G06F 9/4408; G06F 9/441; G06F 2213/0026; G06F 15/7867; G06F 15/7871; G06F 11/26
See application file for complete search history.

(56) References Cited

U.S. PATENT DOCUMENTS

| | | | |
|---|---|---|---|
| 6,920,627 | B2 | 7/2005 | Blodget et al. |
| 7,302,625 | B1 | 11/2007 | Payakapan et al. |
| 7,856,545 | B2 | 12/2010 | Casselman |
| 8,145,894 | B1 | 3/2012 | Casselman |
| 10,031,993 | B1 * | 7/2018 | Poornachandran ........................ H03K 19/17704 |
| 10,719,366 | B1 * | 7/2020 | Gasser .................. G06F 9/5044 |
| 10,776,142 | B1 * | 9/2020 | Seshadri ............... G06F 9/3877 |
| 10,795,742 | B1 * | 10/2020 | Khan ..................... G06F 11/301 |
| 2016/0321088 | A1 * | 11/2016 | Xie ..................... G06F 15/7871 |
| 2020/0099579 | A1 * | 3/2020 | Xie ..................... G06F 9/45558 |

OTHER PUBLICATIONS

Xilinx, "UltraScale Architecture Configuration—User Guide", UG570 (v1.10), pp. 1-220, Feb. 21, 2019.

* cited by examiner

ACCELERATION MODULE SUPPORTING CONTROLLED CONFIGURATION OF A PROGRAMMABLE LOGIC DEVICE

TECHNICAL FIELD

Embodiments described herein relate generally to accelerated modules, and particularly to methods and systems for flexible management of acceleration devices comprising programmable logic.

BACKGROUND

An accelerated module typically comprises an acceleration co-processor that provides fast computing services to a processor. The co-processor may be implemented using programmable logic that can be configured at the field in accordance with end user requirements. Methods for managing programmable logic devices are known in the art.

For example, U.S. Pat. No. 8,145,894 describes reconfiguration of an accelerator module having a programmable logic device. The reconfiguration is performed during runtime without rebooting. For example, a computer is put into a sleep mode, the computer having the accelerator module installed therein. A programmable logic device of the accelerator module is reconfigured while the computer is in the sleep mode.

U.S. Pat. No. 7,302,625 describes a Built-In Self-Test (BIST) system in a Field Programmable Gate Array (FPGA) that can adjust test signal patterns provided for testing after partial reconfiguration of the FPGA. The BIST system includes a decoder that monitors I/O signals and provides an output indicating when I/O signals change indicating partial reconfiguration has occurred. The decoder output is provided to a BIST test signal generator providing signals to an IP core of the FPGA as well as a BIST comparator for monitoring test results to change test signals depending on the partial configuration mode.

SUMMARY

An embodiment that is described herein provides an electronic device that includes a processor, a Nonvolatile Memory (NVM), and a Programmable Logic Device (PLD). The NVM is configured to store a loadable shell image and a loadable user image. The shell image supports at least communication with the processor, and each of the shell image and the user image implements a bus client for communication with a host in accordance with a bus protocol. The PLD is coupled to the processor and to the NVM, and is configured to load the shell image into the PLD upon initialization and run the loaded shell image, to receive from the processor, by the shell image, a load indication for selecting between the shell image and the user image, and when the load indication selects the user image, to load the user image into the PLD and run the loaded user image, such that the process of loading the shell image and then the user image completes before the host concludes attempting to enumerate the bus client of the user image, in accordance with the bus protocol.

In some embodiments, the electronic device includes a host interface coupled between the PLD and the host, wherein the host interface is configured to respond to host enumeration requests, on behalf of the bus client of the shell image or of the user image, before the respective shell image or user image loads successfully. In other embodiments, the bus protocol includes a Peripheral Component Interconnect Express (PCI-E) bus protocol, and the host interface includes a PCI-E switch that supports generating retry notifications in response to the enumeration requests. In yet other embodiments, the processor is configured to receive the load indication from the host using the bus protocol, and in response to a notification from the PLD that the shell image has been successfully loaded, to provide the load indication to the PLD. "PCI-E" is also referred to herein simply as "PCIE".

In an embodiment, when the load indication received by the shell image indicates that loading the user image is required, the PLD is configured to load the user image within a predefined time period from the initialization. In another embodiment, when running the shell image, the PLD is configured to receive a command from the host, using the bus protocol, and to execute the received command using the shell image. In yet another embodiment, the command includes burning an image to the NVM. In yet further another embodiment, the command includes performing a diagnostic test to at least part of the PLD.

In some embodiments, the PLD is configured to load the shell image after the initialization, and to select between the shell image and the user image, based on a value of the load indication that was set by the processor before the initialization.

There is additionally provided, in accordance with an embodiment that is described herein, a method, including, in an electronic device that includes a Programmable Logic Device (PLD) coupled to a processor and to a Nonvolatile Memory (NVM) that stores a loadable shell image and a loadable user image, the shell image supports at least communication with the processor, the electronic device further includes a bus client for communication with a host in accordance with a bus protocol, loading the shell image into the PLD upon initialization, and running the loaded shell image. A load indication for selecting between the shell image and the user image is received from the processor, by the shell image. When the load indication selects the user image, the user image is loaded into the PLD and the loaded user image is run. A process of loading the shell image and then the user image is completed before the host concludes attempting to enumerate the bus client of the user image, in accordance with the bus protocol.

These and other embodiments will be more fully understood from the following detailed description of the embodiments thereof, taken together with the drawings in which:

DETAILED DESCRIPTION OF EMBODIMENTS

Overview

An electronic module may serve in various different applications that require intensive computations. For maximal flexibility, the electronic module may comprise a hardware engine implemented using a programmable logic device. An electronic module in which the hardware engine is used for computing acceleration is also referred to herein as an "accelerated module".

In the context of the present disclosure and in the claims, the term "Programmable Logic Device" (PLD) refers to any type of electronic device that comprises programmable logic, untied to any specific technology or vendor. The description that follows refers mainly to a Field Programmable Gate Array (FPGA) device, as one example of a PLD.

An FPGA device is typically loaded with a suitable program that implements a desired functionality. A program loadable into a FPGA device is also referred to as an "image". The process of programming an FPGA by loading an image into the FPGA is also referred to as a "configuration" process.

Embodiments that are described herein provide systems and methods for controlled configuration of a programmable logic device. In the disclosed embodiments, multiple images are stored in a Nonvolatile Memory (NVM) and are loaded selectively into the FPGA.

Typically, an end user of the accelerated module designs his or her own image for implementing the required application-specific functionality within the FPGA device. In principle, the user may use a software tool to merge his or her image with a service image provided, e.g., by the FPGA vendor. The service image may implement various services such as testing the FPGA and burning an image into the NVM.

In the above naïve approach, the entire merged image is loaded into the FPGA, which then runs the service part or user part of the merged image, on demand. The service part is therefore loaded into the FPGA device, even though it is typically rarely used, but nevertheless occupies valuable space within the FPGA. The loaded service part may also increase the FPGA power consumption.

In some disclosed embodiments, both a shell image and a user image are stored in an NVM, but are separately loaded into the FPGA. As a result, the user image has more FPGA space for implementing the application-specific functionality. Moreover, the shell image can be loaded after a subsequent power-up cycle.

In some embodiments, a processor coupled to the FPGA device sets a load indication that selects between the shell image and the user image. Upon power-up, the FPGA device first loads and runs the shell image. The shell image receives the load indication from the processor, and based on the indication, continues to run the shell image, or loads and runs the user image. In this loading scheme, the FPGA either loads the shell image alone, or loads the shell image and then overwrites the shell image with the user image.

In some embodiments, each of the shell image and the user image implements an instance of a Peripheral Component Interconnect Express™ (PCI-E) interface that is used for communication with a host over PCI-E. In the present disclosure, "PCI-E" is also referred to simply as "PCIE". In some embodiments, a host interface implemented using a non-standard enhanced PCIE switch, connects each of the processor and the FPGA to the host. The enhanced PCIE switch responds to host enumeration requests, on behalf of the bus client of the shell image or of the user image, before the respective shell image or user image loads successfully.

In an embodiment, the enhanced PCIE switch generates retry notifications to the host, in response to the host enumeration requests, before the relevant image successfully loads and the respective bus client becomes functional.

In some embodiments, the sequential process of loading the shell image followed by the user image must take less than one second, in order to meet a time constraint for discovering PCIE client devices on the PCIE bus.

In some embodiments, the processor receives the load indication from the host over PCIE, and in response to a notification from the FPGA that the shell image has been successfully loaded, provides the load indication to the shell image running on the FPGA. In an embodiment, when the load indication received by the shell image selects the user image, the FPGA loads and runs the user image.

In some embodiments, the NVM to which the FPGA connects additionally stores a factory image that is typically provided by the FPGA vendor as a proven image. The factory image is sometimes referred to as a "Golden image". In such embodiments, in response to detecting that loading the shell image has failed, the FPGA loads the factory image from the NVM, and runs the factory image instead of the shell image.

When running the shell image, the FPGA receives commands from the host, over PCIE, and executes the received commands using the shell image. Possible commands comprise, for example, burning an image to the NVM and performing a diagnostic test to at least part of the FPGA.

In the disclosed techniques, the FPGA loads a shell image after a power-up cycle, and selects between the shell image and a user image based on a load indication that was set by the processor before the power-up cycle. Since host enumeration requests require response even before the image loads and the bus client becomes functional, a non-standard PCIE switch may need to respond to host enumeration requests, on behalf of the PCIE bus client of the relevant (shell or user) image being loaded. In some disclosed embodiments, functions such as image burning and PLD diagnostics are implemented in a shell image that is loaded separately from the user image. When such functions are excluded from the user image, more space remains available in the PLD for user logic implemented in the user image.

System Description

Figure 1:
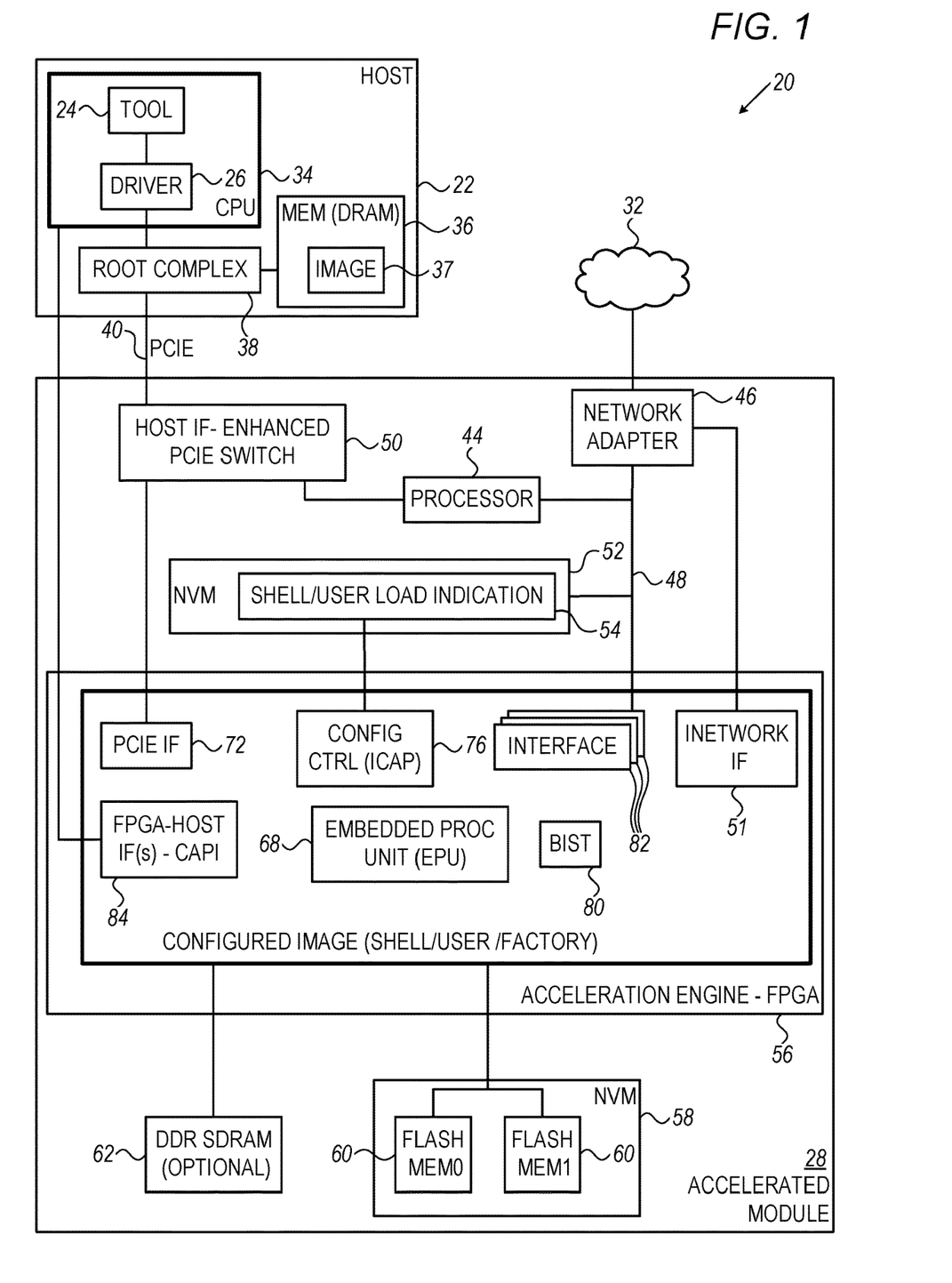
FIG. 1 is a block diagram that schematically illustrates a computer comprising a host and an accelerated module that is implemented using programmable logic, in accordance with an embodiment that is described herein.

FIG. 1 is a block diagram that schematically illustrates a computer 20 comprising a host 22 and an accelerated module 28 that is implemented using programmable logic, in accordance with an embodiment that is described herein.

Computer 20 comprises, for example, a server or a network node that may be used in various applications in which a large number of network nodes communicate with one another over a communication network 32. Applications of this sort comprise, for example, data centers, high performance computing (HPC) and cloud computing, to name a few. Alternatively, computer 20 may comprise a stand-alone computer.

Communication network 32 may comprise a packet network of any suitable type, operating using any suitable communication protocol. For example, communication network 32 may comprise an Ethernet network or an InfiniBand™ network.

Host 22 comprises a CPU 34 coupled to one or more devices such as a local memory 36, via a root complex 38. In the present example, memory 36 comprises a Dynamic Random Access Memory (DRAM) device, but any other suitable type of memory can also be used. Memory 36 may store an image 37 to be burned into a nonvolatile memory, for loading into a programmable device, as will be described in detail below. The root complex connects CPU 34 to accelerated module 28 using a link (bus) 40, in the present example, a PCIE bus. In PCIE topology, the root complex connects to each PCIE device using a serial link. Communication over PCIE is carried out using a packet-based bus protocol. A device or interface coupled to bus functions as a bus client, in accordance with the underlying bus protocol.

At power-up, the host typically enumerates devices that are connected to the PCIE bus, using the root complex. In some embodiments, root complex 38 of the host sends discovery requests over the bus (also referred to herein as "enumeration requests," and expects to receive completion response notifications, from each device on the bus, within one second. In some embodiments, a device that is not yet ready, should respond to a discovery request with a retry notification, which causes the root complex to send a subsequent discovery request, up to one second from power-up. In PCIE terminology, a retry notification is also referred to as a Configuration Request Retry Status (CRS).

In some embodiments, the host runs a tool program 24 that may access accelerated module 28 over PCIE using a driver program 26. The tool program is operable by a human user using a user interface that comprises, for example, a keyboard device and a display device (not shown.)

Accelerated module 28 comprises a processor 44, which connects to communication network 32 using a network adapter 46 via a suitable bus 48, and to CPU 34 using a host interface 50. Host interface 50 is coupled between host 22 and FPGA 56, and provides communication between the host and FPGA 56. In the present example, Host interface is additionally coupled between processor and the host and provides communication between the host and the processor. Network adapter 46 may comprise, for example, a suitable Network Interface Controller (NIC) that communicates packets over the communication network. In the present example, host interface 50 comprises an enhanced PCIE switch that connects to host 22 via PCIE link 40. Processor 44, which is coupled between host interface 50 and network adapter 46, performs various tasks such as, mediating packet delivery between the communication network via network adapter 46, and host 22 via host interface 50. In some embodiments, FPGA 56 comprises a network interface 51 for communicating over the communication network via network adapter 46.

In some embodiments, on power-up, host interface 50 receives enumeration requests from root complex 38 and distributes the enumeration requests to processor 44 and to FPGA 56. Note that processor 44 is typically available to respond to the enumeration request with a completion notification, but the FPGA is able to respond only when an image that implements a suitable bus client loads successfully and runs. In some embodiments, when the bus client in the FPGA is not yet available, the host interface responds to an enumeration request, on behalf of the FPGA, by sending to the root complex a retry notification. In an embodiment, the host interface may generate the retry notifications, on behalf of the FPGA, internally. In another embodiment, another element that is coupled to the FPGA and to the host interface generates the retry notifications, on behalf of the FPGA, and the host interface routes the retry notifications to the host. This process may repeat until an image that implements a valid bus client loads successfully.

Processor 44 is coupled to a NVM 52 via bus 48. The processor stores in NVM 52 a load indication for controlling image loading, as will be described in detail below.

Host interface 50, network adapter 46 and processor 44 typically comprise dedicated hardware logic for carrying out the methods described herein. Alternatively or additionally, at least some of the functions of processor 44 may be implemented in software on a suitable embedded processor.

Accelerated module 28 comprises an acceleration engine 56 that provides accelerated computing services to processor 44. In FIG. 1, acceleration engine 56 is implemented in hardware using a programmable logic device such as a Field-Programmable Gate Array (FPGA) device. Using programmable logic, different acceleration engines may be implemented by different users or by the same user at different times. In the description that follows, the terms "acceleration engine" and "FPGA" are used interchangeably.

FPGA device 56 may comprises any suitable programmable logic device. As will be described below, in some disclosed embodiments, the FPGA comprises features that are supported, for example, by Xilinx™ FPGA devices. The disclosed embodiments are not limited in any way to Xilinx FPGA devices, and are applicable to other FPGAs and other programmable devices of other vendors. Relevant Xilinx FPGA features include, for example, loading an image on power-up from address 0 or another address of the NVM. Another feature comprises a mechanism for image reconfiguration, which is referred to as an Internal Configuration Access Port (ICAP) module in Xilinx terminology. Some Xilinx FPGA devices additionally support fallback to a "Golden image" upon image loading failure. These and other features of Xilinx FPGA devices are described, for example, in a document entitled "UltraScale Architecture Configuration—User Guide," UG570 (v1.10), Feb. 21, 2019.

In the example of FIG. 1, acceleration engine 56 can be used for accelerating (or offloading) any computationally-intensive task for processor 44, for host or both. Tasks that may be implemented in hardware within accelerated engine 56 comprise, for example, data encryption and decryption or data compression and decompression of data that processor 44 communicates over network 32. Alternatively or additionally, any other suitable accelerated task can also be used.

To implement an application-specific functionality within the FPGA, the FPGA device should be programmed with a corresponding program that is referred to as a "bit-stream" or "image." As will be described in detail below, an image may be loaded into internal FPGA configuration logic, e.g., at power-up or on demand. The FPGA device typically comprises built-in configuration functions that can access the configuration logic for reading or writing.

Some FPGA logic, e.g., the configuration functions, remains operational after a power-up cycle, i.e., such logic is sometimes referred to as hard-IP that is implemented as part of the FPGA chip. An image loaded into the FPGA is, however, stored in the FPGA in a volatile memory, and should be loaded again after a subsequent power-up cycle.

In accelerated module 28, one or more loadable images are stored in a Nonvolatile Memory (NVM) 58. Such images can therefore be loaded into the FPGA after a power-up cycle. In the present example, NVM 58 comprises two Flash devices 60, each of which connects to the FPGA using a ×4 Quad Serial Peripheral Interface (QSPI). Flash device 60 may comprise a storage space of 512 Megabit, or any other suitable amount of storage space. In the present example configuration, the image data is split between the two QSPI Flash devices, and is read by the FPGA in parallel, for fast loading. In some embodiments, upon power-up, the FPGA is configured to automatically load an image from address 0 of the NVM, in a SPI master mode (SPI×8). After loading an image, the FPGA runs the loaded image to achieve the functionality implemented by that image.

In the example of FIG. 1, accelerated module 28 comprises a Double Data Rate (DDR) Synchronous Dynamic Random-Access Memory (SDRAM) 62, which is optional, and can be used, for example, by an acceleration application in the FPGA that requires local storage space.

The FPGA in FIG. 1 comprises a loaded image 64, depicted using emphasized lines. In the present example, at any given time the loaded image may comprise one of (i) a shell image, (ii) a user image and (iii) a factory image. In the disclosed embodiments, as will be described below, the shell image provides various offline services that are controlled by the host. The user image implements application-specific functionality such as the desired acceleration engine functionality. The factory image may be provided by the vendor of the FPGA device, and typically serves as a fallback when loading the shell image fails.

In FIG. 1, loaded image 64 comprises various elements that are internally interconnected. Loaded image 64 is also referred to herein as "configured image." The elements of loaded image 64 (e.g., in case of a shell image) comprise, for example, an Embedded Processor Unit (EPU) 68, a PCIE interface 72, a configuration controller 76, a Built-In Test (BIST) module 80, and one or more interfaces 82. The actual elements of a given image are application dependent. For example, in some embodiments, each of the shell image and the user image implements an instance of PCIE interface 72 for communication with CPU over PCIE, via the enhanced PCIE switch (host interface 50.) The PCIE switch enables the host, FPGA image and processor 44 to communicate with one another over PCIE. The enhanced PCIE switch also generates retry notifications, on behalf of the FPGA, as described above.

In some embodiments, the shell image implements EPU 68 that controls various tasks of the shell image within the FPGA. For example, the EPU handles the process of burning an image into NVM 58. The EP receives the image data (e.g., image 37 in memory 36) from the host over PCIE, and programs the image into Flash devices 60. This feature enables the user to update the shell image and/or the user image stored in the NVM, when required.

Configuration controller 76 is used, e.g., by the shell image, for loading an image into the FPGA device, when some image is already loaded and running. As noted above, a module in Xilinx FPGA devices that implements similar functionality to that of configuration controller is referred to as "ICRP". Using reconfiguration controller 76, the FPGA device may use the configuration functions of the FPGA device, for writing into and reading out of the FPGA configuration logic. In some embodiments, when triggered, the configuration controller clears the currently loaded image, and loads an image from NVM 58 starting at a predefined address in the NVM. This address may be specified, for example, in a Warm Boot Starting Address (WBSTAR) register of the FPGA device (not shown.)

In some embodiments, processor 44 manages in NVM 52 a load indication 54 that indicates to the shell image running in the FPGA device whether or not to reconfigure the FPGA device with a user image. The FPGA automatically loads the shell image upon power-up, and based on the load indication, decides whether to continue running the shell image, or to load the user image in place of the shell image, using configuration controller 76.

In an embodiment, the shell image in the FPGA device may receive the load indication upon request, e.g., using an interrupt signal. In another embodiment, the FPGA indicates to the processor that loading the shell image is done successfully, and in response, processor 44 provides the load indication to the FPGA device.

Interfaces 82 between processor 44 and the FPGA device are application dependent. In some embodiments, an interface 82 comprises a General Purpose Input/Output (GPIO) interface via which the processor accesses elements of the FPGA such as various registers. In an embodiment, the processor provides load indication 54 stored in NVM 52 to the FPGA via the GPIO interface.

In some embodiments, the FPGA device further comprises one or more FPGA-Host interfaces 84 that provide direct communication between the host (CPU 34) and the FPGA. Interfaces 84 may comprise, for example, a Coherent Accelerator Processor Interface (CAPI) via which CPU 34 communicates with the FPGA device for the purpose of acceleration. The CAPI may be implemented based on the OpenCAPI™ technology of the OpenCAPI consortium. In the present example, the CAPI version being used is not layered on top of PCIE, such as, for example, the OpenCAPI 3 version. In some embodiments, one or more interfaces 84 are uses for monitoring and controlling fan operation and/or temperature within the chassis of host 22.

In some embodiments, the shell image implements an instance of BIST module 80. The BIST module can be used, for example, for performing diagnostic tests to various elements (e.g., DDR SDRAM 62) and interfaces of the FPGA. In some embodiments, the BIST is controlled and monitored by tool program 24 running on the host, e.g., by writing and reading relevant information to one or more registers or address locations within the FPGA.

The configurations of computer 20, accelerated module 28 and FPGA 56 shown in FIG. 1 are example configurations, which are chosen purely for the sake of conceptual clarity. In alternative embodiments, any other suitable computer, accelerated module and FPGA configurations can also be used. Elements that are not necessary for understanding the principles of the present invention, such as various interfaces, addressing circuits, timing and sequencing circuits and debugging circuits, have been omitted from the figure for clarity.

Some elements of accelerated module 28 such as processor 44 may be implemented in hardware, e.g., in one or more Application-Specific Integrated Circuits (ASICs) or FPGAs. Additionally or alternatively, processor 44 can be implemented using software, or using a combination of hardware and software elements. NVM 52 may comprise any suitable nonvolatile storage such as, for example, a Flash memory device.

In some embodiments, some of the functions of the processor 44 may be carried out by a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

Controlled Loading of Images from a NVM

In some embodiments, the FPGA is configured to select between a shell image and a user image. The shell image provides offline services such as performing diagnostic tests to the FPGA, burning images to the NVM and the like. The user image implements application-specific functionality such as accelerated computation for the processor of the accelerated module and/or for CPU 34. Methods for controlled loading of the shell image and the user image are described below.

Figure 2:
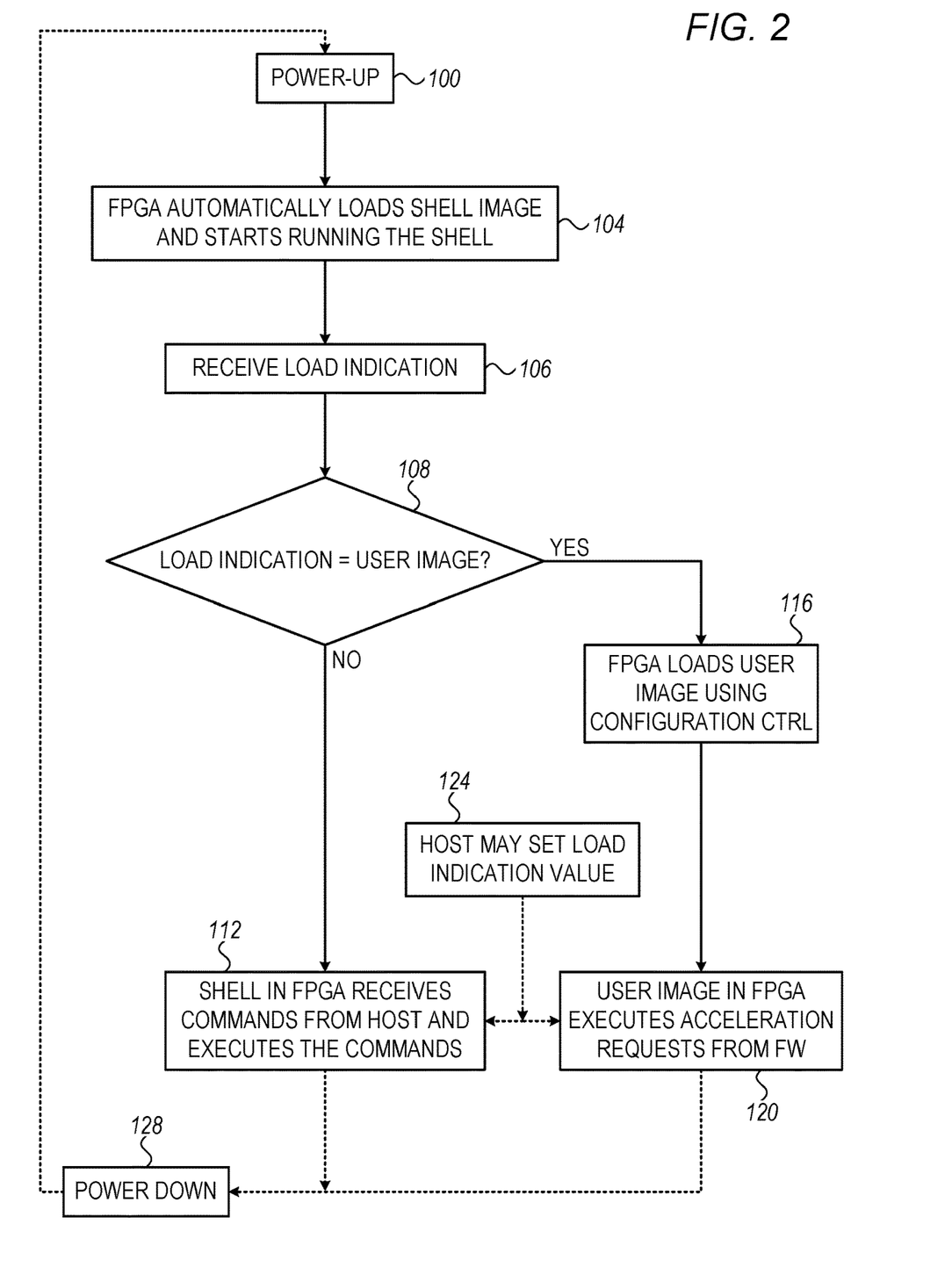
FIG. 2 is a flow chart that schematically illustrates a method for controlled loading and execution of selected images in a FPGA device, in accordance with an embodiment that is described herein.

FIG. 2 is a flow chart that schematically illustrates a method for controlled loading and execution of selected images in a FPGA device, in accordance with an embodiment that is described herein.

The method will be described as being executed by FPGA 56 of accelerated module 28 of FIG. 1. In describing the method, it is assumed that loadable shell image and user image are stored in NVM 58. In addition, it is assumed that load indication 54 has been configured in NVM 52 by processor 44, to indicate a selected image between the shell image and the user image. Processor 44 is also referred to as a "Firmware" (FW).

The method begins, at a power-up step 100, with FPGA 56 receiving operational power, e.g., from a power supply of computer 20 (not shown). At a shell image loading step 104, in response to the operational power, the FPGA automatically loads the shell image from NVM 58, and when successfully loaded, the shell image starts running.

At an indication reception step 106, the shell image receives load indication 54 from processor 44. The load indication may indicate the image shell to (i) continue running the shell image or (ii) to reconfigure the FPGA by loading the user image to replace the image shell. At an indication testing step 108, the shell image checks the value of the load indication, and if the value indicates that loading the user image is not required, the method proceeds to a shell running step 112.

At step 112, the shell image continues running, and receives commands from tool program 24 running on host 22, via PCIE interface 72 of the shell image directly, or via the PCIE interface to processor 44 and further via a suitable interface 82. The shell image executes the received commands and possibly reports status information back to the tool program. For example, the shell image may receive a command to test an element of the FPGA, in which case the shell image executes the requested test using BIST module 80, for example. The shell image may report a test result to the host by writing test results to registers or address location in the FPGA that are accessible by the host over PCIE.

When at step 108, loading the user image is required, the FPGA clears the shell image and loads the user image instead, using configuration controller 76, at a user image loading step 116. When loaded successfully, the FPGA runs the user image, at a user image execution step 120. In the present example, the user image preforms accelerated computations for CPU 34 or for processor 44 (FW), such as, for example, data encryption/decryption. In some embodiments, the user image receives acceleration commands from the host over PCIE via host interface 72. In another embodiment, CPU 34 communicates acceleration commands with the FPGA device using FPGA-HOST interface 84. In yet another embodiment, the user image comprises as an interface (e.g., 82) for communicating acceleration commands between the processor and the FPGA. The user image receives acceleration requests from the host or processor, executes the requests, and returns to the host or processor corresponding response messages.

During the execution of the shell image at step 112, or the user image at step 120, processor 44 may receive from host 22, e.g., over PCIE, a value to set into load indication 54, at an indication setting step 124. The value indicates loading the shell image or the user image. Note that the FPGA will use an updated indication value for selecting one of the shell and user images only after a subsequent power-up cycle.

In some embodiments, the FPGA loads the shell image automatically and the host interface starts enumeration, in response to power-up or in response to receiving a reset signal or any other suitable condition being satisfied. In the context of the present disclosure and in the claims, the term "initialization" refers to any event that (i) forces the FPGA to initialize by clearing the FPGA and reloading an image from NVM address 0 or another predefined address, and (ii) starting a bus enumeration process by the host.

In some embodiments, at a power down step 128, the operational power of the FPGA goes down, resulting in losing the currently loaded image. In an alternative embodiment, at step 128, the host applies to the FPGA a reset signal (not shown) that causes reloading the shell image and restarts enumeration by the host. Step 128 is typically executed by the user for reloading and running one of the shell and user images. Following step 128 the method loops back to step 100 to complete a power-up cycle (or loops back to step 104 to complete a reset cycle.) The FPGA then runs the shell image that now receives the updated value of the load indication, and continues running the shell image, or loads the user image, accordingly.

In the method of FIG. 2 the shell image is always loaded first. When loaded, the shell image runs and checks whether or not to load the user image. This controlled loading scheme, allows the user to exclude from the user image design, some or all of the functionality of the shell image such as diagnostic tests, which provides more configurable space within the FPGA for user image. Moreover, the user may return to the shell image by configuring the load indication to indicate the shell image (at step 124) and applying a power-up cycle or reset, or fulfilling any other suitable condition that causes shell image reload and starting bus enumeration by the host.

In some embodiments, each of the shell image and the user image implements an instance of PCIE interface 72. This means that loading the shell image and then the user image should be sufficiently fast so that the PCIE interface of the user image is ready before the host concludes attempting to enumerate the bus client of the user image.

In some embodiments, the shell image and the user image should complete loading within approximately one second from the power-up event, which is the maximal time period allocated for the enumeration process. In some embodiments, the FPGA signals to the processor when an image loads successfully, and at least one of the FPGA and processor verifies that loading the image has completed within a predefined timeout.

Figure 3:
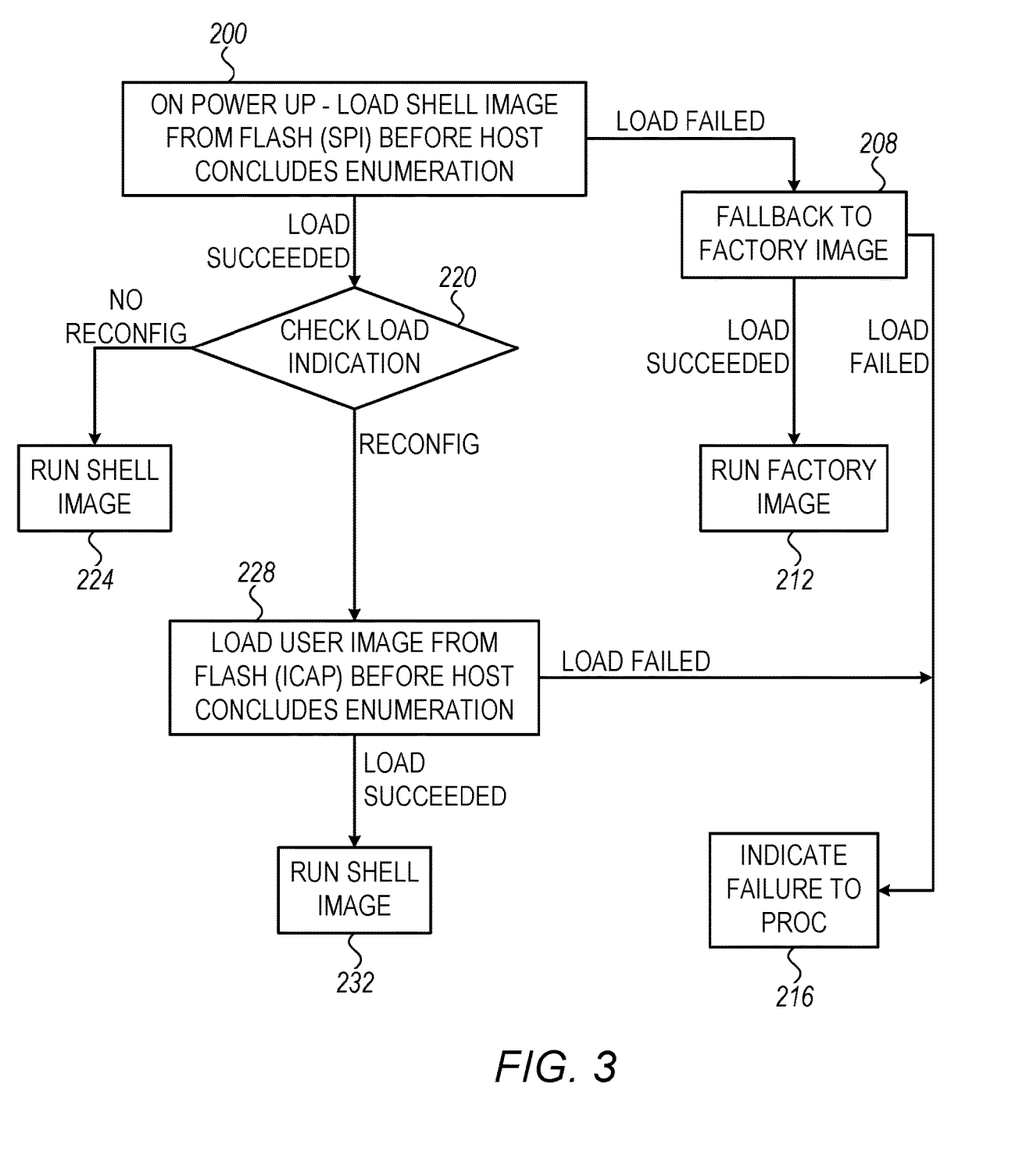
FIG. 3 is a flow chart that schematically illustrates a method for sequential loading of shell and user images that meets PCIE enumeration constraint, in accordance with an embodiment that is described herein.

FIG. 3 is a flow chart that schematically illustrates a method for sequential loading of shell and user images that meets PCIE enumeration constraint, in accordance with an embodiment that is described herein. The disclosed embodiments are not limited to a PCIE bus, but are applicable to other suitable bus types that enumerate client devices.

In describing the method, a shell image, user image, and factory image, are assumed to be stored in NVM 58 in accordance with the memory map depicted in Table 1 below.

TABLE 1

Map of NVM storing factory, shell and user images

| Address (Hex) | Image |
| --- | --- |
| 0x0000_0000<br>0x00FF_FFFF | Factory image header -> shell image + Factory image |

TABLE 1-continued

Map of NVM storing factory, shell and user images

| Address (Hex) | Image |
|---|---|
| 0x0100_0000<br>0x02FF_FFFF | User image |
| 0x0300_0000<br>0x03FF_FFFF | Shell Image |

In the example of Table 1, the factory image, user image and shell image reside at starting addresses 0x0000_0000, 0x0100_0000 and 0x0300_0000, respectively. The addresses are denoted in hexadecimal format. In addition, the factory image comprises a header part that contains control information such as a pointer to the shell address, 0x0300_0000 in the present example.

The NVM memory map in Table 1 is given by way of example, and other suitable memory maps can also be used. In some embodiments, the images reside in NVM the order factory image, User image and Shell image. In some embodiments, the address gap between the factory image and the shell image is determined sufficiently large to allow space for large user images.

Burning images into NVM 58, as depicted for example in Table 1, can be done in various ways. In some embodiments, the factory image is burned into NVM 58 using a service tool of the FPGA vendor, e.g., using a serial interface such as a Joint Test Action Group (JTAG) debug port. The shell and user images may then be burned into NVM 58 over PCIE using burning functionality implemented in the factory image.

The method of FIG. 3 begins with FPGA 56 loading a shell image from the NVM, upon power-up, at a shell loading step 200, the FPGA loads the shell image from the NVM. As noted above, since the shell image comprises an instance of PCIE interface 72, the shell image must be loaded successfully before the host concludes attempting to enumerate the PCIE devices in the accelerated module.

In some embodiments, to load the shell image, the FPGA device first reads the header of the factory image from NVM address 0 upon power-up, and extracts the address of the shell image from the header of the factory image. In other embodiments, any other method for loading the shell image upon power-up can also be used. The FPGA device accesses the NVM for read/load using any suitable mode of operation such as, for example, the SPI master mode.

Loading an image, and in particular the shell image, may fail for various reasons, such as due to a CRC error or a timeout error, as described herein. In some embodiments, the image comprises a Cyclic Redundancy Check (CRC) calculated over the image bit-stream. A CRC error may occur when a CRC calculated over the loaded image fails to match the CRC of the image in the NVM. A timeout error may occur when loading the images takes longer than a predefined timeout period.

In some embodiments, in response to a failure in loading the shell image at step 200, the FPGA loads the fallback factory image, at a factory image loading step 208. When the factory image has been loaded successfully, the FPGA runs the factory image at a factory image running step 212. Otherwise, loading the factory image at step 208 has failed, and the FPGA indicates a failure to processor 44, at a failure indication step 216.

When at step 200, loading the shell image has succeeded, the FPGA runs the shell image, which checks load indication 54 provided by processor 44, at a load indication checking step 220. When no reconfiguration is required, i.e., the load indication indicates the shell image, the FPGA continues running the shell image at a shell execution step 224. Otherwise, the shell image detects (at step 220) that loading the user image is required, and triggers the FPGA to load the user image, using configuration controller 76, at a user image loading step 228. Similarly to step 200 above, since the user image comprises an instance of PCIE interface 72, the user image must be loaded successfully before the host concludes attempting to enumerate the PCIE devices in the accelerated module.

If loading the user image at step 228 fails, the FPGA indicates a load failure to processor 44, at step 216. Otherwise, loading the user image has succeeded, and the FPGA runs the user image at a user image execution step 232.

The embodiments described above are given by way of example, and other suitable embodiments can also be used. For example, although the embodiments above mainly refer to FPGA devices, the disclosed embodiments are similarly applicable to other suitable programmable logic devices.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An electronic device, comprising:
   a processor;
   a Nonvolatile Memory (NVM), configured to store a loadable shell image and a loadable user image, wherein the shell image supports at least communication with the processor, and wherein each of the shell image and the user image implements a bus client for communication with a host in accordance with a bus protocol; and
   a Programmable Logic Device (PLD) coupled to the processor and to the NVM, the PLD is configured to:
      upon initialization, load the shell image into the PLD and run the loaded shell image;
      receive from the processor, by the shell image, a load indication for selecting between the shell image and the user image; and
      when the load indication selects the user image, load the user image into the PLD and run the loaded user image, wherein a process of loading the shell image and then the user image completes before the host concludes attempting to enumerate the bus client of the user image in accordance with the bus protocol.

2. The electronic device according to claim 1, and comprising a host interface coupled between the PLD and the host, wherein the host interface is configured to respond to host enumeration requests, on behalf of the bus client of the shell image or of the user image, before the respective shell image or user image loads successfully.

3. The electronic device according to claim 2, wherein the bus protocol comprises a Peripheral Component Interconnect Express (PCI-E) bus protocol, and wherein the host interface comprises a PCI-E switch that supports generating retry notifications in response to the enumeration requests.

4. The electronic device according to claim 1, wherein the processor is configured to receive the load indication from the host using the bus protocol, and in response to a notification from the PLD that the shell image has been successfully loaded, to provide the load indication to the PLD.

5. The electronic device according to claim 1, wherein when the load indication received by the shell image indicates that loading the user image is required, the PLD is configured to load the user image within a predefined time period from the initialization.

6. The electronic device according to claim 1, wherein when running the shell image, the PLD is configured to receive a command from the host, using the bus protocol, and to execute the received command using the shell image.

7. The electronic device according to claim 6, wherein the command comprises burning an image to the NVM.

8. The electronic device according to claim 6, wherein the command comprises performing a diagnostic test to at least part of the PLD.

9. The electronic device according to claim 1, wherein the PLD is configured to load the shell image after the initialization, and to select between the shell image and the user image, based on a value of the load indication that was set by the processor before the initialization.

10. A method, comprising:
in an electronic device that comprises a Programmable Logic Device (PLD) coupled to a processor and to a Nonvolatile Memory (NVM) that stores a loadable shell image and a loadable user image, wherein the shell image supports at least communication with the processor, and wherein a bus client performs communication with a host in accordance with a bus protocol,
loading the shell image into the PLD upon initialization, and running the loaded shell image;
receiving from the processor, by the shell image, a load indication for selecting between the shell image and the user image; and
when the load indication selects the user image, loading the user image into the PLD and running the loaded user image, wherein a process of loading the shell image and then the user image completes before the host concludes attempting to enumerate the bus client of the user image in accordance with the bus protocol.

11. The method according to claim 10, and comprising responding, by a host interface that is coupled between the PLD and the host, to host enumeration requests, on behalf of the bus client of the shell image or of the user image, before the respective shell image or user image loads successfully.

12. The method according to claim 11, wherein the bus protocol comprises a Peripheral Component Interconnect Express (PCI-E) bus protocol, and wherein the host interface comprises a PCI-E switch that supports generating retry notifications in response to the enumeration requests.

13. The method according to claim 10, wherein receiving the load indication comprises receiving the load indication from the host using the bus protocol, and in response to a notification from the PLD that the shell image has been successfully loaded, providing the load indication to the PLD.

14. The method according to claim 10, wherein loading the user image comprises loading the user image, when the load indication received by the shell image indicates that loading the user image is required, within a predefined time period from the initialization.

15. The method according to claim 10, and comprising, when running the shell image, receiving a command from the host, using the bus protocol, and executing the received command using the shell image.

16. The method according to claim 15, wherein the command comprises burning an image to the NVM.

17. The method according to claim 15, wherein the command comprises performing a diagnostic test to at least part of the PLD.

18. The method according to claim 10, and comprising loading the shell image after the initialization, and selecting between the shell image and the user image, based on a value of the load indication that was set before the initialization.

* * * * *